(12) United States Patent
Suzuki

(10) Patent No.: US 12,173,939 B2
(45) Date of Patent: Dec. 24, 2024

(54) CHILLER SYSTEM

(71) Applicant: Tokyo Seimitsu Co., Ltd., Tokyo (JP)

(72) Inventor: Katsuhiko Suzuki, Tokyo (JP)

(73) Assignee: TOKYO SEIMITSU CO., LTD., Tokyo (JP)

(*) Notice: Subject to any disclaimer, the term of this patent is extended or adjusted under 35 U.S.C. 154(b) by 0 days.

(21) Appl. No.: 18/771,586

(22) Filed: Jul. 12, 2024

(65) Prior Publication Data

US 2024/0369270 A1 Nov. 7, 2024

Related U.S. Application Data

(63) Continuation of application No. PCT/JP2022/045620, filed on Dec. 12, 2022.

(30) Foreign Application Priority Data

Jan. 14, 2022 (JP) ................ 2022-004587

(51) Int. Cl.
*F25B 41/20* (2021.01)
*F25B 49/02* (2006.01)

(52) U.S. Cl.
CPC ........... *F25B 41/20* (2021.01); *F25B 49/02* (2013.01); *F25B 2313/02732* (2013.01); *F25B 2600/2519* (2013.01)

(58) Field of Classification Search
CPC ............ F25B 41/20; F25B 49/02; F25B 2313/02732; F25B 2600/2519; C23C 16/463; C23C 14/541; H01L 21/683
See application file for complete search history.

(56) References Cited

U.S. PATENT DOCUMENTS

2008/0093057 A1* 4/2008 Choi ............ H01L 21/67109
165/104.33
2020/0318230 A1* 10/2020 Nomoto ............ G03F 7/70758

FOREIGN PATENT DOCUMENTS

JP 2008-311492 A 12/2008
JP 2019-117231 A 7/2019
(Continued)

OTHER PUBLICATIONS

International Search Report for PCT/JP2022/045620 (PCT/ISA/210) mailed on Jan. 17, 2023.
(Continued)

*Primary Examiner* — Henry T Crenshaw
(74) *Attorney, Agent, or Firm* — Birch, Stewart, Kolasch & Birch, LLP

(57) ABSTRACT

The chiller system includes an internal circulation path, an external circulation path, and a control device. The internal circulation path is equipped with a refrigerant tank, an internal circulation pump, and a freezer. The external circulation path includes a feed path and a return path the feed path being equipped with an external circulation pump and a temperature sensor. A communication path that provides communication between the return path and the refrigerant tank is equipped with throttle means. The internal circulation path is equipped with an on-off control valve, with one end of the pressurizing path being connected to an upstream side of the on-off control valve in the internal circulation path and the other end being connected to an upstream side of the throttle part in the communication path. The control device controls operation of the on-off control valve based on a measurement result of the temperature sensor.

7 Claims, 3 Drawing Sheets

(56) References Cited

FOREIGN PATENT DOCUMENTS

| | | |
|---|---|---|
| JP | 2019-169547 A | 10/2019 |
| JP | 2019-169548 A | 10/2019 |

OTHER PUBLICATIONS

Written Opinion of the International Searching Authority for PCT/JP2022/045620 (PCT/ISA/237) mailed on Jan. 17, 2023.

* cited by examiner

CHILLER SYSTEM

CROSS-REFERENCE TO RELATED APPLICATIONS

The present application is a Continuation of PCT International Application No. PCT/JP2022/045620 filed on Dec. 12, 2022 claiming priority under 35 U.S.C § 119 (a) to Japanese Patent Application No. 2022-004587 filed on Jan. 14, 2022. Each of the above applications is hereby expressly incorporated by reference, in their entirety, into the present application.

BACKGROUND OF THE INVENTION

Field of the Invention

The present invention relates to chiller systems, and particularly relates to a chiller system that circulates refrigerant to and from a wafer mounting base in an inspection device that electrically inspects chips formed on a wafer.

Description of the Related Art

In a semiconductor manufacturing process, a prober is used to inspect electrical characteristics of chips formed on a wafer. In recent years, in order to shorten an inspection time and reduce costs, the number of chips inspected at the same time is increasing. Even in a case where the chips are dynamic random access memories (DRAMs) or flash memories with a small heat generation amount, the heat generation amount generated from the entire wafer during inspection increases as the number of the chips inspected at the same time becomes larger.

The chips are also used in a wide range of applications, such as in-vehicle chips, and the range of temperature environments during inspection has been expanded in order to ensure that the chips operate normally in appropriate temperature environments for the respective applications. As a result, the heat generation amount of the chips during inspection is increasing under the wide range of temperature environments.

Accordingly, various techniques have been conventionally proposed for controlling the temperature of the surface of a mounting base for mounting a wafer in the prober. For example, Patent Literature 1 discloses a chiller mechanism to control the temperature of a wafer chuck (mounting base) of the prober. The chiller mechanism includes a cooling path and a coolant cooling path.

In the cooling path, a tank that holds the coolant and the wafer chuck are connected through a path extending from the tank to the wafer chuck and a path returning to the tank from the wafer chuck. The coolant is circulated between the tank and the wafer chuck by a pump provided on the cooling path so as to cool the wafer chuck.

In the coolant cooling path, the tank and a cooler are connected through a path extending from the tank to the cooler and a path returning to the tank from the cooler, so that the coolant cooled by the cooler is returned to the tank by a pump provided on the coolant cooling path. Furthermore, since the amount of circulating coolant is regulated by a flow control valve provided on the coolant cooling path, the temperature of the coolant held in the tank is regulated.

CITATION LIST

Patent Literature: Japanese Patent Application Laid-Open No. 2008-311492

SUMMARY OF THE INVENTION

Incidentally, in a case where a chiller mechanism, such as the technique described in Patent Literature 1, is applied to a prober that performs electrical inspection under high temperature, a fluorine-based inert liquid with a high boiling point is conventionally used as coolant.

This is because there may be a problem that temperature cannot be normally control due to occurrence of cavitation in the coolant when the temperature of the coolant exceeds the boiling point, and a problem that an impeller of the circulating pump is damaged due to the cavitation.

However, kinematic viscosity of a coolant with a high boiling point tends to increase at low temperatures, due to increase in viscosity of the coolant. This causes a problem that in the low temperature region, a flow rate of the coolant decreases due to the rise in kinematic viscosity, so that a cooling effect on the wafer mounting base is reduced as compared with a coolant with a low boiling point. There is also a problem that the rise in kinematic viscosity also causes a rise in required shaft power of the circulation pump, resulting in an increase in power consumption.

For these reasons, there is a demand for a system that can deliver the coolant without causing boiling even in a high temperature region, while securing its performance at low temperature by using coolant with a low boiling point. As one method of raising the boiling point of the coolant with a low boiling point, there is a method described in Patent Literature 1, in which pressure is applied to a path of the chiller mechanism with compressed air or the like to raise the boiling point of the coolant.

However, in the configuration such as the chiller mechanism described in Patent Literature 1, it is difficult to locally pressurize only a path from the wafer mounting base to a suction port of the circulation pump that is desired to be pressurized in particular. Thus, it is necessary to pressurize the entire path of the chiller mechanism via a tank or the like.

In this case, it is necessary to enhance pressure resistance performance of devices related to liquid contact parts, including auxiliaries. Because more robust devices are used to constitute the chiller mechanism, the degree of freedom in selection of devices is restricted more, or the devices become larger in size than before. This results in a problem of increase in device costs. In addition, as the devices become larger in size, a problem also arises in which the chiller mechanism incorporating these devices has an increased footprint than before.

The present invention has been made in view of such circumstances, and aims to provide a chiller system having high pressure resistance performance, while saving space and cost.

In order to solve the above problems, the following inventions are provided.

According to a first aspect, a chiller system that circulates refrigerant between a wafer mounting base and a chiller unit, includes: an internal circulation path configured to allow circulation of the refrigerant inside the chiller unit; an external circulation path configured to allow circulation of the refrigerant between the chiller unit and the wafer mounting base; and a control device configured to control the chiller unit, in which the internal circulation path is equipped with a refrigerant tank, an internal circulation pump, and a refrigerator, the external circulation path includes a feed path extending from the chiller unit to the wafer mounting base and a return path returning to the chiller unit from the wafer mounting base, the feed path is equipped with an external circulation pump and a temperature sensor, the return path includes a communication path that provides communication between the return path and the refrigerant tank, the communication path is equipped with throttle means configured to limit a flow rate of the refrigerant flowing into the refrigerant tank, the internal circulation path includes an on-off control valve provided upstream of the refrigerant tank, the chiller system further comprises a pressurizing path for pressurizing the refrigerant flowing through the return path, with one end of the pressurizing path being connected to an upstream side of the on-off control valve in the internal circulation path and the other end of the pressurizing path being connected to an upstream side of the throttle means in the communication path, and the control device controls operation of the on-off control valve based on a set temperature value or a measurement result of the temperature sensor.

According to a second aspect, in the chiller system according to the first aspect, in a case where the set temperature value or the temperature measured by the temperature sensor is equal to or more than a boiling point of the refrigerant or a temperature obtained by subtracting a prescribed margin from the boiling point, the control device closes the on-off control valve.

According to a third aspect, in the chiller system according to the second aspect, in a case where the set temperature value or the temperature measured by the temperature sensor is less than the boiling point of the refrigerant or the temperature obtained by subtracting the prescribed margin from the boiling point, the control device opens the on-off control valve.

According to a fourth aspect, in the chiller system according to the second or third aspects, the return path is equipped with a pressure sensor, and in a case where the set temperature value or the temperature measured by the temperature sensor is equal to or more than the boiling point of the refrigerant (or the temperature obtained by subtracting the prescribed margin from the boiling point), the control device executes pressurization control of the return path based on a pressure measured by the pressure sensor.

According to a fifth aspect, in the chiller system according to the fourth aspect, the control device controls operation of the internal circulation pump based on the pressure measured by the pressure sensor, as the pressurization control.

According to a sixth aspect, in the chiller system according to the fourth or fifth aspect, the throttle means includes an electrically driven valve configured to regulate an opening degree of the communication path, and the control device controls the opening degree of the electrically driven valve based on the pressure measured by the pressure sensor, as the pressurization control.

According to a seventh aspect, the chiller system according to any one of the first to sixth aspects, further includes: a connection path which is provided between the internal circulation path and the external circulation path, and configured to feed the refrigerant flowing through the internal circulation path into the external circulation path; and a three-way valve provided at a connection point between the internal circulation path and the connection path, in which the control device controls operation of the three-way valve based on a measurement result of the temperature sensor.

According to an eighth aspect, in the chiller system according to the seventh aspect, in a case where the temperature measured by the temperature sensor is higher than a prescribed value, the control device opens the connection path using the three-way valve.

According to a ninth aspect, in the chiller system according to the eighth aspect, in a case where the temperature measured by the temperature sensor is lower than the prescribed value, the control device closes the connection path using the three-way valve.

According to a tenth aspect, in the chiller system according to any one of the first to ninth aspects, the feed path is equipped with a heater, and the control device performs control to heat the refrigerant with the heater based on temperature measured by the temperature sensor.

According to the present invention, it is possible to implement a chiller system having high pressure resistance performance, while saving space and cost.

DESCRIPTION OF THE EMBODIMENTS

Hereinafter, a chiller system according to an embodiment of the present invention is described based on the accompanying drawings.

Figure 1:
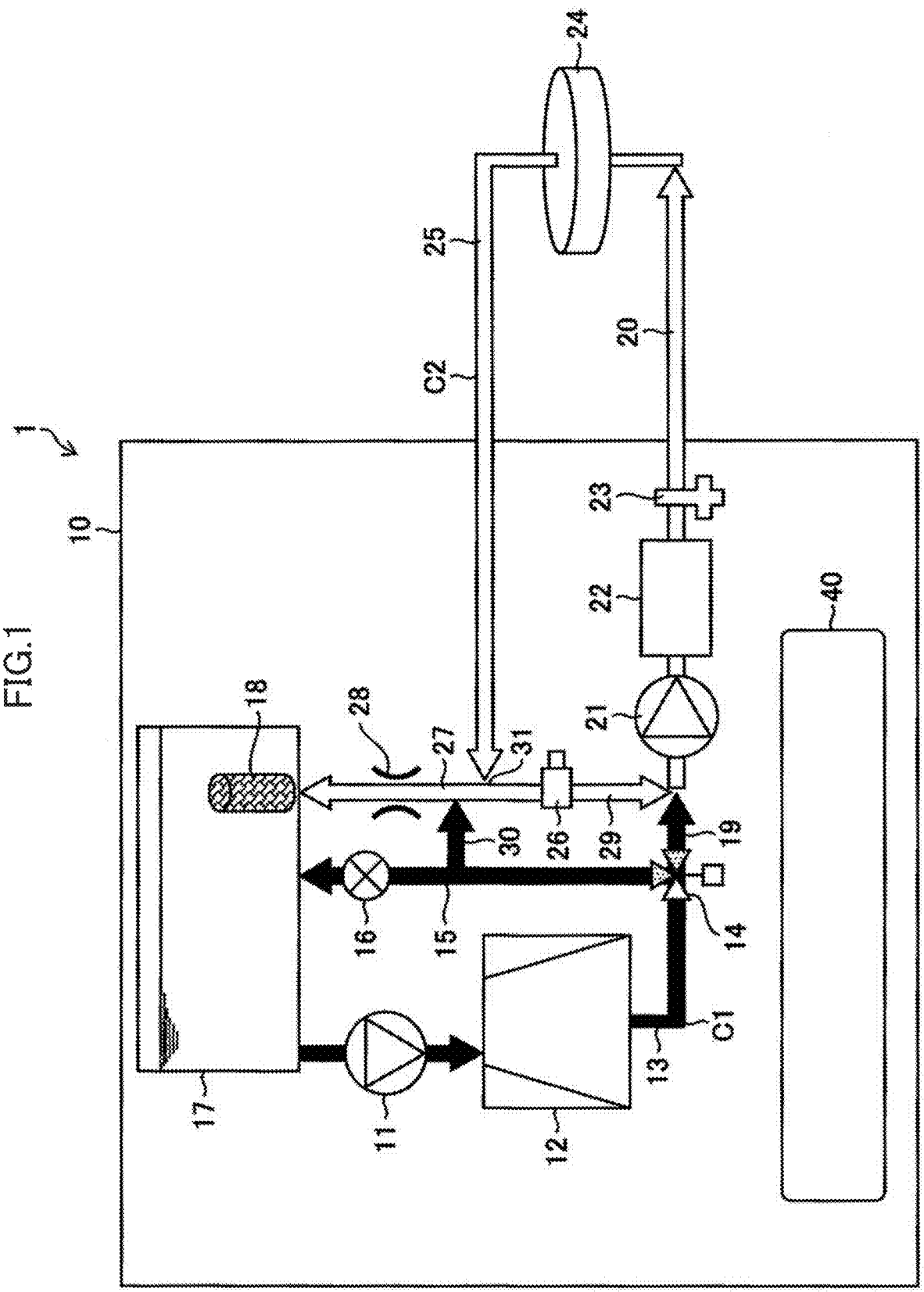
FIG. 1 is a schematic configuration diagram of a chiller system according to a present embodiment.

FIG. 1 shows the schematic configuration of the chiller system according to the present embodiment. As shown in FIG. 1, a chiller system 1 according to the present embodiment includes a chiller unit 10 that circulates refrigerant to cool a wafer mounting base 24, and a control device 40 that controls the entire chiller system 1.

Although any liquid may be used as the refrigerant, high kinematic viscosity causes a rise in shaft power required for a circulation pump, and therefore the refrigerant is preferably a liquid with a relatively low viscosity at low temperatures. More specifically, the refrigerant is, for example, a fluorine-based inert liquid. More specific examples of the fluorine-based inert liquid may include Novec 7200 manufactured by 3M (boiling point of 76° C. under atmospheric pressure), and Galden 135 manufactured by Solvay (boiling point of 135° C. under atmospheric pressure).

Refrigerant with a relatively low viscosity at low temperatures tends to have a low boiling point. Here, the low boiling point refers to, for example, the boiling point in the range of about 70° C. to about 140° C. Conversely, a high boiling point refers to, for example, the boiling point higher than about 150° C. The chiller system 1 may be adequately applied to probers that perform inspection under high temperatures, while taking advantage of refrigerant with a relatively low viscosity at low temperatures.

In the chiller system 1, a refrigerant flow path is roughly divided into an internal circulation path C1 and an external circulation path C2. In FIG. 1, the internal circulation path C1 is shown by black arrows, and the external circulation path C2 is shown by white arrows. The direction of the arrows indicates the flow direction of the refrigerant. In the following description, a proximal-end side of the arrow is described as an upstream side of the flow of the refrigerant, and a distal-end side of the arrow is described as a downstream side of the flow of the refrigerant.

The internal circulation path C1 allows circulation of the refrigerant between a refrigerant tank 17 and a freezer 12 inside the chiller unit 10. The external circulation path C2 allows circulation of the refrigerant between the chiller unit 10 and a wafer mounting base 24. In the case of using the chiller system 1 for a prober that performs inspection under relatively high temperatures, the temperature of the refrigerant may become high temperature close to the boiling point of the refrigerant in the external circulation path C2.

Hereinafter, the configuration of the internal circulation path C1 is described in detail. The internal circulation path C1 is equipped with the refrigerant tank 17, an internal circulation pump 11, and the freezer 12. The refrigerant tank 17 stores the refrigerant. The internal circulation pump 11 feeds the refrigerant supplied from the refrigerant tank 17 to the freezer 12. The freezer 12 cools the refrigerant to a prescribed temperature.

A three-way valve 14 is provided downstream of the freezer 12, and the freezer 12 and the three-way valve 14 are fluidly connected through a path 13. The three-way valve 14 and the refrigerant tank 17 are fluidly connected through a path 15, and an on-off control valve 16 is provided upstream of the refrigerant tank 17 on the path 15. The on-off control valve 16 includes an electrically driven valve, such as a solenoid valve and a motor-operated valve. In addition, the three-way valve 14 and a suction port of an external circulation pump 21 in the external circulation path C2 are fluidly connected through a connection path 19. In short, the connection path 19 fluidly connects the internal circulation path C1 and the external circulation path C2.

In other words, the three-way valve 14 is provided at a connection point connecting the path 13 from the freezer 12 in the internal circulation path C1, the path 15 for returning the refrigerant to the refrigerant tank 17, and the connection path 19. The three-way valve 14 is operated (controlled) so as to switch between: the state where the path 13 and the connection path 19 are fluidly connected and the path 15 is closed; and the state where the path 13 and the path 15 are fluidly connected and the connection path 19 is closed. The control of the three-way valve 14 is described in detail later.

Next, the configuration of the external circulation path C2 is described in detail. The external circulation path C2 is roughly divided into a feed path 20 and a return path 25. The feed path 20 is a path that supplies the refrigerant from the chiller unit 10 to the wafer mounting base 24. The return path 25 is a path that returns the refrigerant to the chiller unit 10 from the wafer mounting base 24.

The feed path 20 is equipped with the external circulation pump 21, a heater 22, and a temperature sensor 23 in this order from an upstream side (the side of the chiller unit 10) to the wafer mounting base 24. The external circulation pump 21 feeds the refrigerant to the wafer mounting base 24. The heater 22 heats the refrigerant flowing through the feed path 20. The temperature sensor 23 measures the temperature of the refrigerant flowing in the feed path 20.

The wafer mounting base 24 is provided with a refrigerant flow path (not shown). The refrigerant flow path is fluidly connected to the feed path 20 and the return path 25. The refrigerant, which is regulated so as to have an appropriate temperature, flows through the refrigerant flow path so that the temperature of the surface of the wafer mounting base 24 is controlled to be a temperature suitable for inspection performed by a prober (inspection device). Since the configuration of the wafer mounting base 24 including the refrigerant flow path is known to the public, detailed description thereof is omitted. After the refrigerant passes through the refrigerant flow path of the wafer mounting base 24, the refrigerant returns to the chiller unit 10 via the return path 25.

At a branch point 31 in the chiller unit 10, the return path 25 branches into a first branch path 29 and a second branch path 27. The first branch path 29 is fluidly connected to the feed path 20 at a point downstream of the three-way valve 14 and upstream of the external circulation pump 21. On the first branch path 29, a pressure sensor 26 is provided to measure the pressure of the refrigerant in the return path 25 (in the first branch path 29 to be specific).

The second branch path 27 is connected to the refrigerant tank 17. On the second branch path 27, throttle means 28 is provided at a point on the upstream side of the refrigerant tank 17. The throttle means 28 is provided with an orifice (a throttle part) that reduces the cross section of the flow path in the second branch path 27. The orifice limits the flow rate of the refrigerant flowing in the second branch path 27. Note that the throttle means 28 may include an electrically driven valve, such as a solenoid valve or a motor-operated valve, as in modifications described later. The second branch path 27 corresponds to the "communication path" of the present invention. Here, in the present invention, the term "communication path" is not limited to the second branch path 27. The term "communication path" is used in a wide range of concepts, and includes the first branch path 29 communicating with the refrigerant tank 17 via the second branch path 27, and the return path 25 that is a branch start point of the first branch path 29 and the second branch path 27.

Furthermore, between the internal circulation path C1 and the external circulation path C2, a pressurizing path 30 is provided to pressurize the return path 25. One end of the pressurizing path 30 (the side of the internal circulation path C1) is positioned on the path 15 in the internal circulation path C1, that is, between the three-way valve 14 and the on-off control valve 16 (i.e., the upstream side of the on-off control valve 16) to be specific. The other end of the pressurizing path 30 (the side of the external circulation path C2) is positioned on the second branch path 27, that is, between the throttle means 28 and the branch point 31 (i.e., the upstream side of the throttle means 28) to be specific. Note that the position of the other end of the pressurizing path 30 is not limited on the second branch path 27, and may be on the first branch path 29, for example.

The refrigerant tank 17 is also equipped with a filter 18. Depending on the characteristics of the refrigerant, when the temperature of the refrigerant reaches the boiling point or above, the refrigerant in the external circulation path C2 may be thermally decomposed and produce harmful substances, such as acids. Accordingly, the chiller system 1 according to the present embodiment is equipped with the filter 18 that adsorbs harmful substances produced in the refrigerant. The filter 18 is desirably provided at a position that is less exposed to high temperatures. Specifically, for example, the filter 18 is provided inside the refrigerant tank 17 (see FIG. 1). However, the illustration is not intended to limit the position of the filter 18.

When the chiller system 1 uses refrigerant with a low boiling point, it is necessary to suppress cavitation of the refrigerant. In the present embodiment, based on the measurement results of the temperature sensor 23 and the pressure sensor 26, the control device 40 described later controls each part of the chiller system 1 (the three-way valves 14, the heater 22, the on-off control valve 16, the internal circulation pump 11) so as to locally pressurize the return path 25 in the external circulation path C2 through the pressurizing path 30. Thus, it is possible to efficiently operate the chiller system 1 while suppressing cavitation of the refrigerant. Accordingly, it is possible to implement the system which can secure the performance at low temperature by using refrigerant with a low boiling point and can also deliver the refrigerant without causing boiling even in a high temperature region, without causing increase in cost and device size for enhancing the pressure resistance performance.

Figure 2:
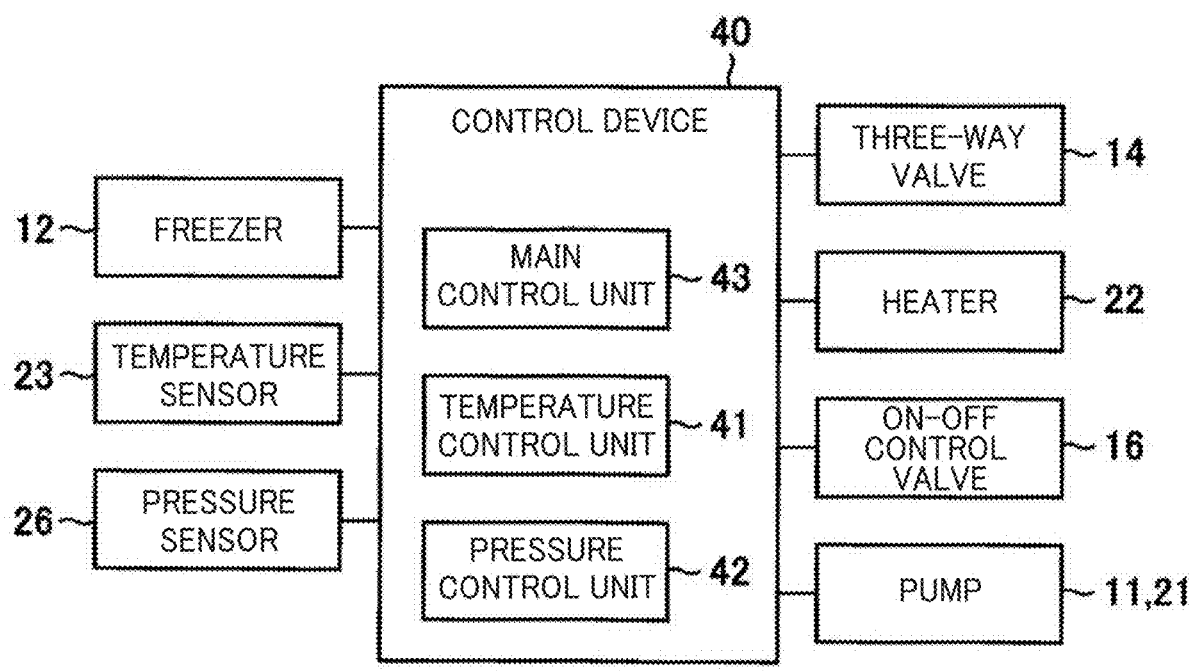
FIG. 2 is a functional block diagram of a control device.

A description is now given of the functional configuration of the control device 40 with reference to FIG. 2. As shown in FIG. 2, the control device 40 includes a main control unit 43, a temperature control unit 41, and a pressure control unit 42. The main control unit 43 comprehensively controls each part of the chiller system 1.

Based on the temperature of the refrigerant inside the feed path 20 of the external circulation path C2 measured by the temperature sensor 23, the temperature control unit 41 controls switching of the three-way valve 14 and heating of the heater 22 so that the refrigerant in the external circulation path C2 has a temperature within a prescribed range.

Based on the temperature of the refrigerant inside the feed path 20 of the external circulation path C2 measured by the temperature sensor 23, the pressure control unit 42 controls opening and closing of the on-off control valve 16. Based on the pressure inside the return path 25 (the first branch path 29) of the external circulation path C2 measured by the pressure sensor 26, the pressure control unit 42 further controls operation (rotational speed) of the internal circulation pump 11. Thus, the pressure control unit 42 controls the pressure in the return path 25 of the external circulation path C2 so as to suppress cavitation of the refrigerant.

The respective units (the main control unit 43, the temperature control unit 41, and the pressure control unit 42) provided in the control device 40 may be implemented by, for example, a personal computer, a workstation, a programmable logic controller (PLC), or the like. The control device 40 includes: a central processing unit (CPU) that controls the operation of each device provided to the chiller system 1; a read only memory (ROM); a storage device (such as, for example, a hard disk drive (HDD) or a solid state drive (SSD) that stores control programs; and a synchronous dynamic random access memory (SDRAM) that can be used as a work area of the CPU.

Further, the control device 40 accepts an operation input from an operator via an operation part (not shown), and transmits control signals in response to the operation input to each part of the chiller system 1 to control the operation of each device. Examples of the operation part may include a keyboard, a mouse, and a touch panel.

Figure 3:
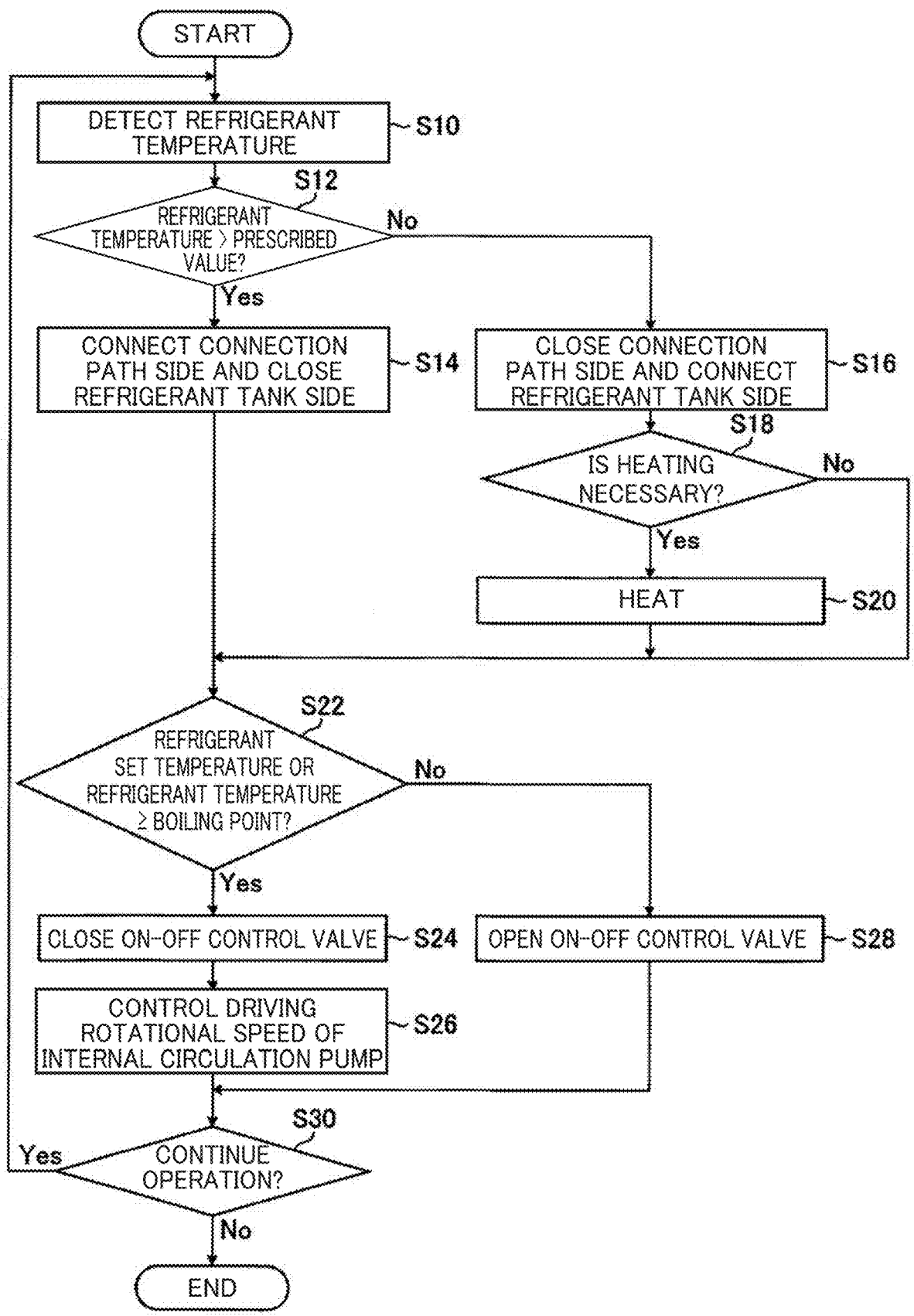
FIG. 3 is a flowchart showing a control method of the chiller system.

A description is now given of a control method of the chiller system 1 with reference to FIG. 3. First, the control device 40 measures the temperature of the refrigerant flowing in the feed path 20, with the temperature sensor 23 (step S10). Here, the temperature measured by the temperature sensor 23 represents a temperature generally (substantially) equal to the temperature of the refrigerant supplied to the wafer mounting base 24. The temperature control unit 41 of the control device 40 then determines whether or not the temperature of the refrigerant measured in step S10 is higher than a prescribed value (step S12).

In a case where the temperature of the refrigerant is higher than the prescribed value (step S12: YES), the temperature control unit 41 drives the three-way valve 14 to provide fluid communication between the path 13 on the side of the freezer 12 and the connection path 19, and closes the path 15 on the side of the refrigerant tank 17 (step S14). In other words, the temperature control unit 41 opens the connection path 19 with the three-way valve 14. Then, the processing proceeds to step S22.

In the internal circulation path C1, the refrigerant that is cooled by the freezer 12 to have a constant low temperature, circulates. In a case where the temperature of the refrigerant measured in step S10 is higher than the prescribed value (set value), the temperature of the refrigerant flowing through the external circulation path C2 needs to be lowered. The temperature control unit 41 provides fluid communication between the path 13 on the side of the freezer 12 and the connection path 19 with the three-way valve 14, and closes the path 15 on the side of the refrigerant tank 17. As a result, the refrigerant having low temperature and flowing in the internal circulation path C1 is mixed with the refrigerant having high temperature and flowing in the external circulation path C2, and thereby the temperature of the refrigerant flowing through the external circulation path C2 is lowered.

A mixture ratio between the refrigerant having low temperature and flowing in the internal circulation path C1 and the refrigerant having high temperature and flowing in the external circulation path C2 at the three-way valve 14 is set by the temperature control unit 41 as appropriate, depending on the temperature of the refrigerant measured in step S10.

Meanwhile, in a case where the temperature of the refrigerant measured in step S10 is equal to or lower than the prescribed value (step S12: No), it is not necessary to lower the temperature of the refrigerant. Therefore, the temperature control unit 41 provides fluid communication between the path 13 on the side of the freezer 12 and the path 15 on the refrigerant tank 17 with the three-way valve 14, and closes the connection path 19 (step S16). This prevents the refrigerant having low temperature and flowing through the internal circulation path C1 from flowing into the external circulation path C2 via the connection path 19. When the chiller system 1 is in operation, the temperature control unit 41 receives feedback of the refrigerant temperature measured by the temperature sensor 23, and the temperature control unit 41 continuously controls the three-way valve 14 based on the feedback.

After step S16, the temperature control unit 41 determines whether or not the temperature of the refrigerant measured in step S10 is within a prescribed range in order to determine whether to heat the refrigerant (step S18). In a case where the temperature of the refrigerant is not within the prescribed temperature range (step S18: YES), it is necessary to heat the refrigerant because the temperature of the refrigerant in the external circulation path C2 is too low. Accordingly, the temperature control unit 41 heats the refrigerant using the heater 22 (step S20), and the processing proceeds to step S22. Meanwhile, in a case where the temperature of the refrigerant is within the prescribed temperature range (step S18: NO), it is not necessary to heat the temperature of the refrigerant in the external circulation path C2, and therefore the processing proceeds to step S22 without performing the processing in step S20 (heating the refrigerant with the heater 22).

Then, in step S22, the pressure control unit 42 of the control device 40 determines whether or not the temperature of the refrigerant or the set temperature of the refrigerant is equal to or higher than the boiling point of the refrigerant in the environment of the external circulation path C2. The temperature of the refrigerant used in this determination is preferably the temperature of the refrigerant measured by the temperature sensor 23 immediately before step S22 is executed. It is also possible to use the temperature of the refrigerant measured in step S10. In a case where the temperature of the refrigerant or the set temperature of the refrigerant is equal to or higher than the boiling point of the refrigerant (step S22: YES), the pressure control unit 42 closes the on-off control valve 16 (step S24). Accordingly, the refrigerant flowing through the internal circulation path C1 flows to the side of the second branch path 27 via the pressurizing path 30. Because the throttle means 28 limits the flow rate of refrigerant flowing toward the refrigerant tank 17, the pressure increases in the return path 25 of the external circulation path C2.

Here, in a case where the on-off control valve 16 is closed (step S24), because the second branch path 27 is narrowed by the throttle means 28, the pressing pressure, which is required to feed the refrigerant from the side of the internal circulation path C1, toward the path (i.e., the return path 25) from the wafer mounting base 24 to the suction port of the external circulation pump 21, also increases.

Therefore, the pressure control unit 42 increases the driving rotational speed of the internal circulation pump 11 based on the pressure measured by the pressure sensor 26 provided on the first branch path 29 in order to raise the pressing pressure of the internal circulation pump 11, applied via the pressurizing path 30 (step S26). Here, it is preferable that the internal circulation pump 11 includes an inverter driven pump.

The pressure inside the return path 25 of the external circulation path C2 may be increased to a vapor pressure (equilibrium vapor pressure) of the refrigerant or higher by using the throttle means 28 to narrow part of the refrigerant flow path (the second branch path 27) extending to the refrigerant tank 17 and by increasing the pressing pressure of the internal circulation pump 11. Thus, the refrigerant may efficiently circulate within the external circulation path C2 while suppressing the cavitation of the refrigerant.

Here, in the path (i.e., the return path 25) from an outlet of the refrigerant flow path in the wafer mounting base 24 to the suction port of the external circulation pump 21, the pressure tends to lower, and therefore the pressure control as described above is performed. On the other hand, the feed path 20 is in a pressurized state from the beginning because delivery pressure of the external circulation pump 21 is applied to the feed path 20. Therefore, no particular mechanism is provided in the feed path 20 to prevent pressure reduction in the feed path 20.

Meanwhile, in a case where the temperature of the refrigerant or the set temperature of the refrigerant is lower than the boiling point of the refrigerant (step S22: NO), the control device 40 opens the on-off control valve 16 (step S28). This allows the refrigerant flowing through the internal circulation path C1 to flow into the refrigerant tank 17 via the path 15 on which the on-off control valve 16 is provided. Thus, pressurization with the pressing pressure of the internal circulation pump 11 is not performed in the range of the path from the wafer mounting base 24 to the suction port of the external circulation pump 21 (i.e., in the return path 25 of the external circulation path C2). Because pressurization with the pressing pressure of the internal circulation pump 11 is not performed, it is possible to obtain a larger pressure difference between the inlet and the outlet of the refrigerant flow path in the wafer mounting base 24, so that the wafer mounting base 24 may be cooled more effectively due to increase in flow rate of the refrigerant that flows through the refrigerant flow path in the wafer mounting base 24.

The control device 40 repeats the processing in steps S10 to S28 while the chiller system 1 is in operation (step S30). Therefore, efficient operation of the chiller system 1 can be achieved while cavitation of the refrigerant is suppressed.

In the present embodiment, a description has been given of the case where the pressure control unit 42 determines whether to open or close the on-off control valve 16 based on whether or not the temperature of the refrigerant or the set temperature of the refrigerant is equal to or more than the boiling point of the refrigerant. However, in order to ensure that the external circulation pump 21 does not cause cavitation, it is necessary to pressurize the refrigerant up to a saturated vapor pressure of the refrigerant or more, and it is also necessary to consider the pressure reduction at the suction port of the external circulation pump 21. Therefore, opening and closing of the on-off control valve 16 may be determined based on whether or not the temperature of the refrigerant or the set temperature of the refrigerant is equal to or more than a value obtained by subtracting a prescribed margin, which takes these pressure fluctuations into account, from the boiling point of the refrigerant.

[Effects]

As described in the foregoing, in the chiller system 1 according to the present embodiment, the operation of the on-off control valve 16 provided in the internal circulation path C2 is controlled based on the measurement result of the temperature sensor 23 provided in the external circulation path C1 so that a part of the external circulation path C2 (the return path 25) may be locally pressurized through the pressurizing path 30. Thus, the chiller system 1 can be efficiently operated while suppressing cavitation of the refrigerant. Accordingly, without causing an increase in cost and device size for enhancing the pressure resistance performance, it possible to implement the system which can secure the performance at low temperature by using refrigerant with a low boiling point and can also deliver the refrigerant without causing boiling even in a high temperature region. As a result, it is possible to implement the chiller system that is low in cost, small in occupancy space, and high in pressure resistance performance.

Specifically, in a case where the set temperature of the refrigerant or the temperature of the refrigerant measured by the temperature sensor 23 is equal to or more than the boiling point of the refrigerant, the on-off control valve 16 is closed (closed) so as to perform pressurization through the pressurizing path 30 with the pressing pressure of the internal circulation pump 11 in the range of the path from the wafer mounting base 24 to the suction port of the external circulation pump 21 (i.e., in the return path 25 of the external circulation path C2). The driving rotational speed of the internal circulation pump 11 is also increased based on the measurement result of the pressure sensor 26 provided in the external circulation path C2, so as to raise the pressing pressure of the internal circulation pump 11. Thus, it is possible to increase the pressure in the return path 25 of the external circulation path C2 so as to suppress the cavitation of the refrigerant.

Meanwhile, in a case where the set temperature of the refrigerant or the temperature of the refrigerant measured by the temperature sensor 23 is less than the boiling point of the refrigerant, the on-off control valve 16 is opened (opened), to allow the refrigerant flowing through the internal circulation path C1 to flow into the refrigerant tank 17 via the path 15 where the on-off control valve 16 is provided. Thus, the pressurization with the pressing pressure of the internal circulation pump 11 is not performed. Because it is possible to obtain a larger pressure difference between the inlet and the outlet of the refrigerant flow path in the wafer mounting base 24, the wafer mounting base 24 may be effectively cooled due to increase in flow rate of the refrigerant that flows through the refrigerant flow path in the wafer mounting base 24.

In the chiller system 1 according to the present embodiment, the connection path 19 connecting the internal circulation path C1 and the external circulation path C2 is opened or closed by the three-way valve 14 based on the measurement result of the temperature sensor 23 provided in the external circulation path C2. This allows the refrigerant having low temperature and flowing through the internal circulation path C1 to circulate inside the internal circulation path C1 or to flow into the external circulation path C2. Therefore, the temperature of the refrigerant flowing through the external circulation path C2 may be controlled within a prescribed range.

[Modifications]

In the above embodiment, the case where the pressure control unit 42 controls the driving rotation speed of the internal circulation pump 11 based on the pressure measured by the pressure sensor 26 has been shown as the method of increasing the pressing pressure of the internal circulation pump 11. However, the present invention is not limited to the case. For example, the throttle means 28 may include an electrically driven valve (such as a solenoid valve and a motor-operated valve) that can regulate the opening degree of the second branch path 27, so that the opening degree of the electrically driven valve may be controlled based on the pressure measured by the pressure sensor 26.

As the method of increasing the pressing pressure of the internal circulation pump 11, both the control of the driving rotation speed of the internal circulation pump 11 based on the pressure measured by the pressure sensor 26 and the control of the opening degree of the electrically driven valve of the throttle means 28 may be used.

Although the embodiment of the present invention has been described in the foregoing, the present invention is not limited to the above examples, and it is naturally understood that various improvements and modifications are possible without departing from the gist of the present invention.

REFERENCE SIGNS LIST

1 ... Chiller system, 10 ... Chiller unit, 11 ... Internal circulation pump, 12 ... Freezer, 13, 15 ... Path, 14 ... Three-way valve, 16 ... on-off control valve, 17 ... Refrigerant tank, 18 ... Filter, 19 ... Connection path, 20 ... Feed path, 21 ... External circulation pump, 22 ... Heater, 23 ... Temperature sensor, 24 ... Wafer mounting base, 25 ... Return path, 26 ... Pressure sensor, 27 ... Second branch path, 28 ... Throttle means, 29 ... First branch path, 30 ... Pressurizing path, 31 ... Branch point, 40 ... Control device, C1 ... Internal circulation path, C2 ... External circulation path

What is claimed is:

1. A chiller system that circulates refrigerant between a wafer mounting base and a chiller unit, comprising:
   an internal circulation path configured to allow circulation of the refrigerant inside the chiller unit;
   an external circulation path configured to allow circulation of the refrigerant between the chiller unit and the wafer mounting base; and
   a control device configured to control the chiller unit, wherein
   the internal circulation path is equipped with a refrigerant tank, an internal circulation pump, and a refrigerator,
   the external circulation path includes a feed path extending from the chiller unit to the wafer mounting base and a return path returning to the chiller unit from the wafer mounting base,
   the feed path is equipped with an external circulation pump and a temperature sensor,
   the return path includes a communication path that provides communication between the return path and the refrigerant tank,
   the communication path is equipped with throttle part configured to limit a flow rate of the refrigerant flowing into the refrigerant tank,
   the internal circulation path includes an on-off control valve provided upstream of the refrigerant tank,
   the chiller system further comprises a pressurizing path for pressurizing the refrigerant flowing through the return path, with one end of the pressurizing path being connected to an upstream side of the on-off control valve in the internal circulation path and the other end of the pressurizing path being connected to an upstream side of the throttle part in the communication path, and
   the control device controls operation of the on-off control valve based on a set temperature value or a measurement result of the temperature sensor.

2. The chiller system according to claim 1, wherein when the set temperature value or the temperature measured by the temperature sensor is equal to or more than a boiling point of the refrigerant or a temperature obtained by subtracting a prescribed margin from the boiling point, the control device closes the on-off control valve.

3. The chiller system according to claim 2, wherein when the set temperature value or the temperature measured by the temperature sensor is less than the boiling point of the refrigerant or the temperature obtained by subtracting the prescribed margin from the boiling point, the control device opens the on-off control valve.

4. The chiller system according to claim 2, wherein the return path is equipped with a pressure sensor, and in a case where the set temperature value or the temperature measured by the temperature sensor is equal to or more than the boiling point of the refrigerant, the control device executes pressurization control of the return path based on pressure measured by the pressure sensor.

5. The chiller system according to claim 4, wherein the control device controls operation of the internal circulation pump based on the pressure measured by the pressure sensor, as the pressurization control.

6. The chiller system according to claim 4, wherein the throttle part includes an electrically driven valve configured to regulate an opening degree of the communication path, and
   the control device controls the opening degree of the electrically driven valve based on the pressure measured by the pressure sensor, as the pressurization control.

7. The chiller system according to claim 1, comprising:
   a connection path which is provided between the internal circulation path and the external circulation path, and configured to feed the refrigerant flowing through the internal circulation path into the external circulation path; and
   a three-way valve provided at a connection point between the internal circulation path and the connection path, wherein
   the control device controls operation of the three-way valve based on a measurement result of the temperature sensor.

* * * * *